United States Patent [19]
Xiang et al.

[11] Patent Number: 5,866,473
[45] Date of Patent: Feb. 2, 1999

[54] METHOD OF MANUFACTURING A POLYSILICON GATE HAVING A DIMENSION BELOW THE PHOTOLITHOGRAPHY LIMITATION

[75] Inventors: Qi Xiang, Santa Clara; Ming-Ren Lin, Cupertino, both of Calif.

[73] Assignee: Advanced Micro Devices, Inc., Sunnyvale, Calif.

[21] Appl. No.: 961,853

[22] Filed: Oct. 31, 1997

[51] Int. Cl.$^6$ .................. H01L 21/3205; H01L 21/4763
[52] U.S. Cl. .......................................... 438/585; 438/595
[58] Field of Search .............................. 438/305, 301, 438/528, 585, 595

[56] References Cited

U.S. PATENT DOCUMENTS

| | | | |
|---|---|---|---|
| 5,476,802 | 12/1995 | Yamazaki et al. | |
| 5,712,173 | 1/1998 | Liu et al. | |
| 5,739,064 | 4/1998 | Hu et al. | 438/528 |
| 5,750,430 | 5/1998 | Son | 438/303 |
| 5,750,435 | 5/1998 | Pan | 438/525 |
| 5,759,901 | 6/1998 | Loh et al. | 438/305 |
| 5,776,821 | 7/1998 | Haskell et al. | 438/585 |
| 5,786,256 | 7/1998 | Gardner et al. | 438/305 |

*Primary Examiner*—Richard A. Booth
*Attorney, Agent, or Firm*—H. Donald Nelson

[57] ABSTRACT

A method of manufacturing an MOS transistor having a gate length dimension less than the dimension available by methods available with conventional manufacturing methods that are limited by optical diffraction in photolithography. The method includes forming a polysilicon gate structure on a gate oxide layer, forming a nitrogen-doped layer on the polysilicon gate structure, forming selected depth oxide sidewalls on the polysilicon gate structure and etching the nitrogen-doped layer and the oxide sidewalls.

4 Claims, 3 Drawing Sheets

METHOD OF MANUFACTURING A POLYSILICON GATE HAVING A DIMENSION BELOW THE PHOTOLITHOGRAPHY LIMITATION

BACKGROUND OF THE INVENTION

1. Field of the Invention

This invention relates generally to the manufacture of MOS integrated circuit transistors and more specifically this invention relates to the manufacture of MOS integrated circuit transistors having a dimension below the photolithography limitation.

2. Discussion of the Related Art

MOS transistors are used extensively in semiconductor integrated circuit devices. A typical MOS structure is shown in FIG. 1. The typical MOS structure 100 is formed on a semiconductor substrate 102. A source 106 region and a drain 108 region are formed in the semiconductor substrate 102. A gate oxide region 110 is formed on the semiconductor substrate 102. A polysilicon gate 112 is formed on the polysilicon gate 112 and oxide spacers 114 and 116 are formed on each side of the polysilicon gate 112. The gate length is represented by the distance 118 and is dependent upon the dimension 120 of the polysilicon gate 112. Because the strategic approach to improving the speed performance of MOS devices is to continuously reduce device dimensions, especially the gate lengths, it is necessary to decrease the polysilicon dimension 120. The evolution of MOS device technology has been governed mainly by device scaling and the feature size of the MOS gate length has been scaled down in the effort to increase the speed and scale of integration.

The problem with the further scaling of the MOS transistor gate length is the limitation of photolithography technology. The smallest feature size that photolithography technology can pattern is limited by optical diffraction. Current manufacturing lithography technology that uses UV or deep UV light as the light source is not able to pattern the polysilicon gate to achieve a gate length of 0.1 $\mu$m and below.

One method that has been used to achieve dimensions below the limitations of the photolithography technology is a technique called over etching. However, it is very difficult to control the shape and the size of the structures when using the technique of over etching.

Therefore, what is needed is a method of manufacturing MOS transistors that achieves device dimensions below the limitations of photolithography.

SUMMARY OF THE INVENTION

A method of manufacturing an MOS transistor in accordance with the present invention solves the above and other problems associated with the manufacture of conventional MOS transistors that have dimensions limited by optical diffraction effects in photolithography technology.

The above and other objects and advantages of the present invention are attained through a method of manufacturing an MOS transistor the includes forming a gate oxide layer on a semiconductor substrate, forming a polysilicon gate structure on the gate oxide layer, forming a nitrogen-doped layer on the polysilicon gate, forming a selected depth oxide layers on the sides of the polysilicon gate and etching away the nitrogen-doped layer and the oxide layers. The nitrogen-doped layers may be formed by implantation.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the present invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
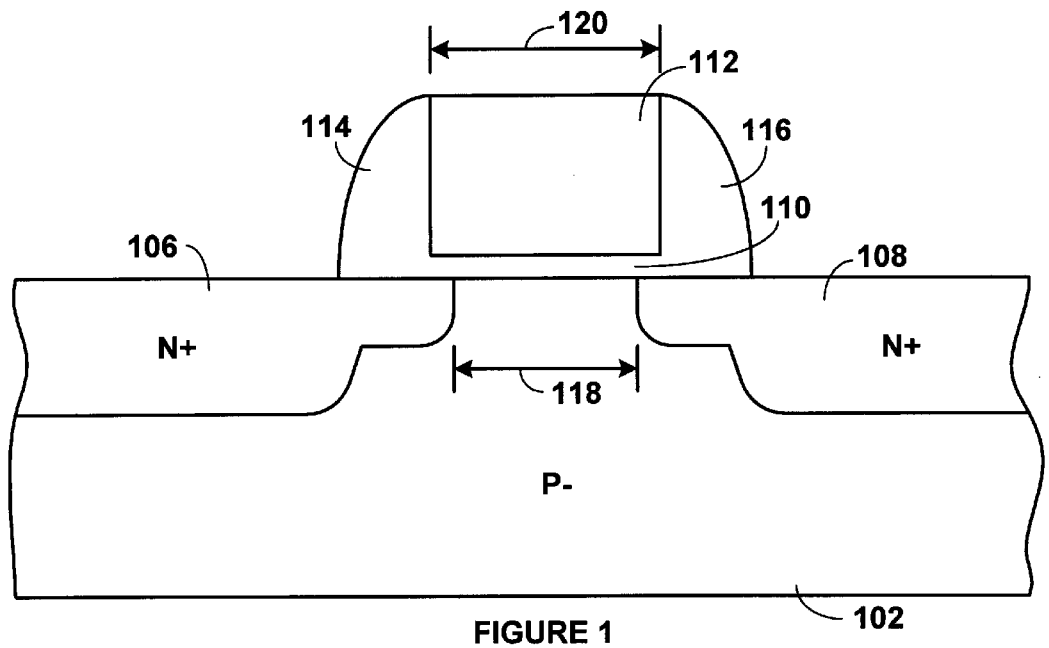
FIG. 1 is a typical MOS transistor as constructed by prior art manufacturing methods.
Figure 2A:
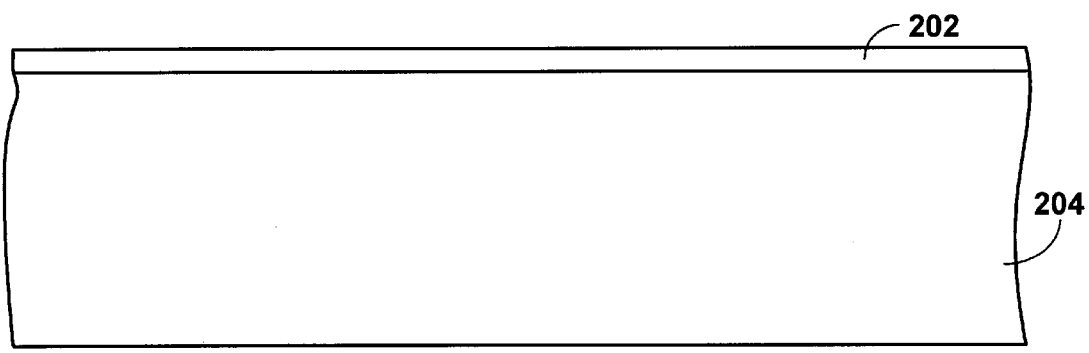
FIG. 2A is an initial step in the manufacture of a MOS transistor in accordance with the present invention showing the formation of a gate oxide on a semiconductor substrate.
Figure 2B:
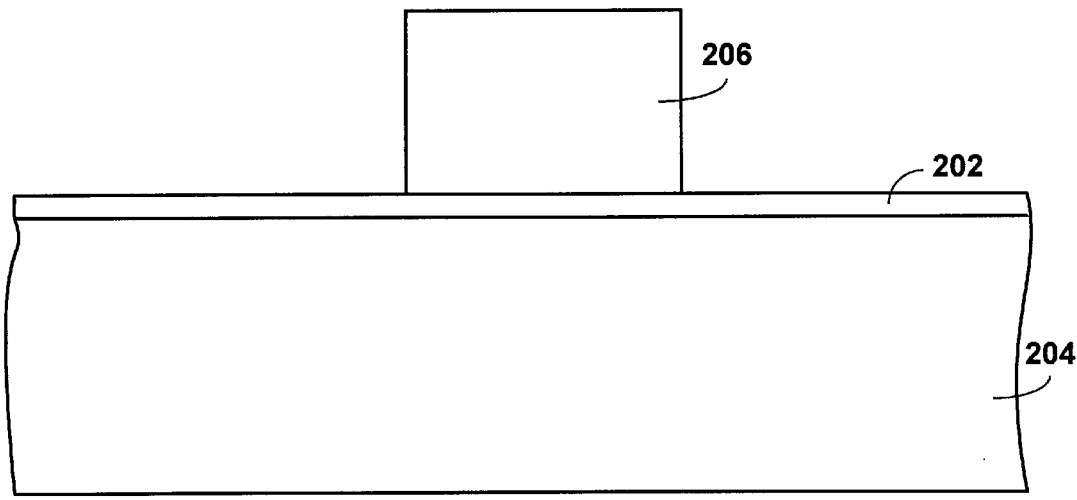
FIG. 2B shows a polysilicon gate formed on the gate oxide as formed in FIG. 2A.

FIG. 2A shows an initial step in the manufacture of the MOS transistor structure in accordance with the present invention. A gate oxide layer 202 is formed on a semiconductor substrate 204. The gate oxide layer 202 is typically a high-k dielectric such as nitrided oxide or silicon nitride. FIG. 2B shows a polysilicon gate electrode 206 formed on the gate oxide layer 202. The polysilicon gate electrode 206 is formed on the gate oxide layer 202 by patterning and etching a polysilicon layer using the gate oxide layer 202 as an etch stop layer. The formation of the polysilicon gate electrode 206 is formed on the gate oxide layer 202 by conventional methods well known in the semiconductor art. The formation of the polysilicon gate electrode 206 is typically accomplished by forming a polysilicon layer on the dielectric layer 202, forming a layer of photoresist on the polysilicon layer, patterning the photoresist and selectively etching the polysilicon to form the gate structure 206. The remaining photoresist is then removed and the structure as shown in FIG. 2B is the result.

Figure 2C:
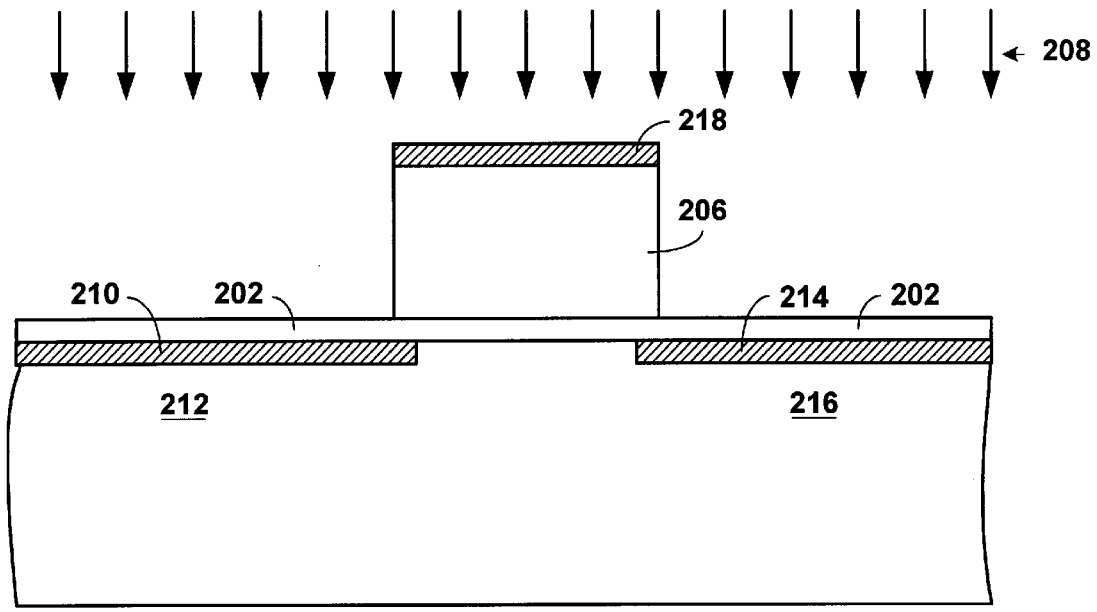
FIG. 2C shows the implantation of nitrogen on the structure as formed in FIG. 2B and the resulting silicon nitride film.

FIG. 2C illustrates the implantation of nitrogen into the surface of the structure as shown in FIG. 2B. Nitrogen is implanted at a concentration in the range $10^{14}$ to $10^5$ ions per $cm^2$ and at an implantation energy in the range 5 to 15 KeV. The arrows 208 indicate the implantation of the nitrogen. The implanted nitrogen results in the thin nitrogen doped layer 210 in the source region 212 and the thin nitrogen doped layer 214 in the drain region 216 and the thin nitrogen doped region 218 on the polysilicon gate 206. The purpose of the nitrogen-doped layer is to retard or prevent oxidation on the top of the polysilicon during a subsequent polysilicon oxidation step (to be discussed). The dosage of the nitrogen can be varied as desired. A low dose of nitrogen that results in only a nitrogen-doped layer may be sufficient to retard the subsequent polysilicon oxidation step. However, a higher dose of nitrogen implantation may be used and the layer 218 on the polysilicon gate 206 will be a silicon nitride layer. The layer 218 whether it is a nitrogen-doped polysilicon layer or a silicon nitride layer will retard or prevent the top of the gate 206 from forming an oxide.

Figure 2D:
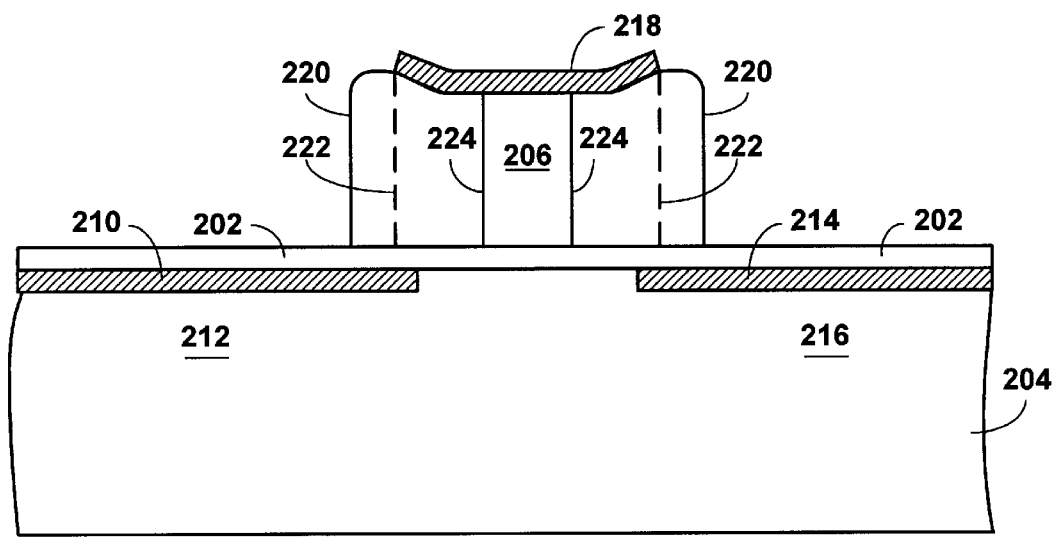
FIG. 2D shows the oxidation of the polysilicon gate.

FIG. 2D shows sidewall oxide layers 220 formed on each side of the polysilicon gate 206. The sidewall oxide layers 220 are thermally grown and controlling the thermal process parameters can control the depth of the oxide layer 222. The nitrogen-doped layer 218 protects the top surface of the polysilicon gate 206 from being oxidized and the high-k gate dielectric (nitrided oxide or silicon nitride) gate oxide layer 202 protects the semiconductor substrate 204 from being oxidized. The dashed lines 222 indicate the original boundaries of the polysilicon gate 206. As discussed above, the original boundaries of the polysilicon gate 206 represent the minimum dimension available from photolithography technology because of optical diffraction. The boundaries of the polysilicon gate 206 represented by solid lines 224 represent a polysilicon gate 206 with dimensions below the dimension available from photolithography technology. Because the polysilicon gate 206 has a smaller dimension, the gate length can have a smaller dimension.

Figure 2E:
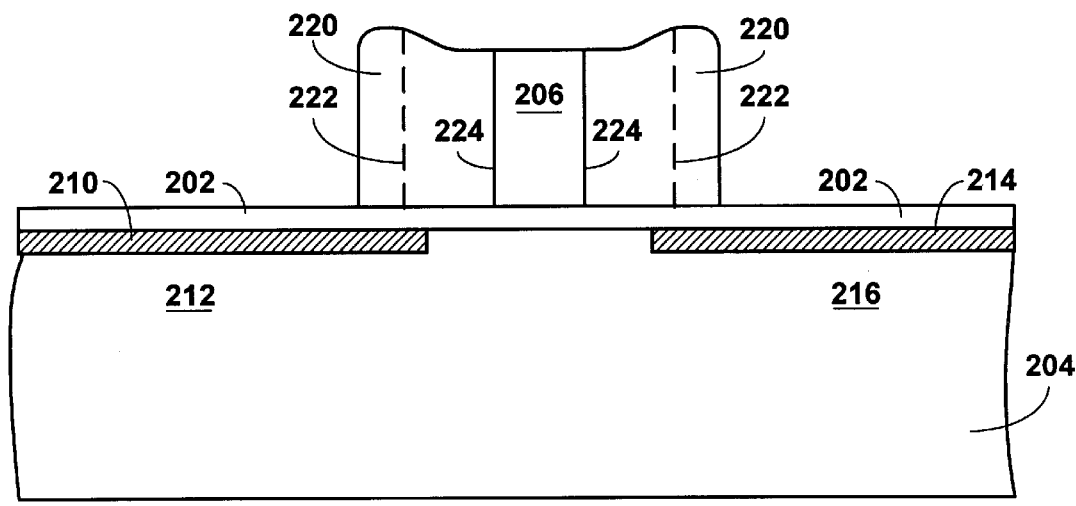
FIG. 2E shows the structure shown in FIG. 2D with the silicon nitride film removed.

FIG. 2E shows the structure shown in FIG. 2D with the nitrogen-doped layer 218 removed. The nitrogen-doped layer 218 is removed by an RIE (Reactive Ion Etch) type anisotropic etch or a selective wet etch such as phosphoric acid.

Figure 2F:
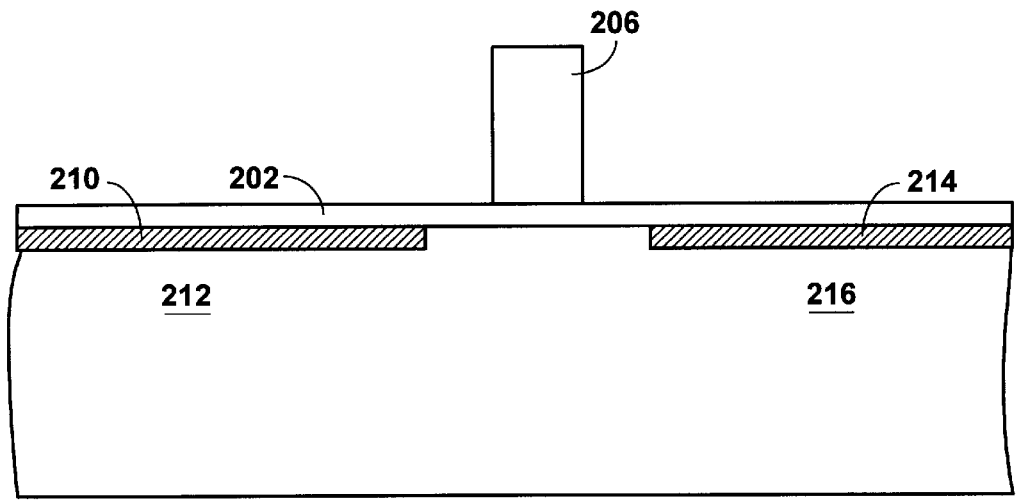
FIG. 2F shows the shows the polysilicon gate with the oxide removed.

FIG. 2F shows the structure shown in FIG. 2E with the sidewalls 220 removed. The sidewalls 220 are removed by an RIE type anisotropic etch to selectively remove the sidewalls 220 leaving the reduced dimension polysilicon gate 206.

The present invention provides the following advantages:

1. better uniformity—oxidation process is more uniform than an etch process;

2. better size control—control of oxidation rate is much better than control of etch rate; and 3. a good gate profile—because no oxidation will occur on the top of the polysilicon gate.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing an MOS transistor comprising:

forming a gate oxide layer on a semiconductor substrate;

forming a polysilicon gate structure on the gate oxide layer;

forming a nitrogen-doped layer in a top surface of the polysilicon gate structure;

forming an oxide layer on the polysilicon gate structure to a selected depth;

removing the nitrogen-doped layer; and removing the oxide layer from the polysilicon gate structure.

2. The method of claim 1 wherein forming a nitrogen-doped layer is accomplished by nitrogen implantation.

3. The method of claim 2 wherein the nitrogen implantation is accomplished at a dosage in the range of $10^{14}$ to $10^{15}$ ions per cm$^2$.

4. The method of claim 3 wherein the nitrogen implantation is accomplished at an energy level in the range of 5 to 15 KeV.

* * * * *